United States Patent
Hara et al.

(10) Patent No.: US 7,991,033 B2
(45) Date of Patent: Aug. 2, 2011

(54) VERTICAL CAVITY SURFACE EMITTING LASER (VCSEL), VCSEL ARRAY DEVICE, OPTICAL SCANNING APPARATUS, AND IMAGE FORMING APPARATUS

(75) Inventors: Kei Hara, Miyagi (JP); Morimasa Kaminishi, Miyagi (JP)

(73) Assignee: Ricoh Company, Ltd., Tokyo (JP)

( * ) Notice: Subject to any disclaimer, the term of this patent is extended or adjusted under 35 U.S.C. 154(b) by 27 days.

(21) Appl. No.: 12/476,689

(22) Filed: Jun. 2, 2009

(65) Prior Publication Data
US 2009/0296768 A1    Dec. 3, 2009

(30) Foreign Application Priority Data

Jun. 3, 2008 (JP) ................... 2008-146000
Jun. 24, 2008 (JP) ................... 2008-165106
Apr. 14, 2009 (JP) ................... 2009-098363
Apr. 14, 2009 (JP) ................... 2009-098364

(51) Int. Cl.
*H01S 3/04* (2006.01)
*H01S 5/00* (2006.01)

(52) U.S. Cl. ........................ 372/50.11; 372/36

(58) Field of Classification Search ............... 372/50.11, 372/36
See application file for complete search history.

(56) References Cited

U.S. PATENT DOCUMENTS

| | | | |
|---|---|---|---|
| 6,110,756 A * | 8/2000 | Otsuka et al. .................. 438/41 |
| 6,566,688 B1 | 5/2003 | Zhang et al. | |
| 6,674,785 B2 | 1/2004 | Sato et al. | |
| 6,765,232 B2 | 7/2004 | Takahashi et al. | |
| 6,927,412 B2 | 8/2005 | Takahashi et al. | |
| 2007/0223546 A1 | 9/2007 | Brenner et al. | |
| 2007/0280322 A1 * | 12/2007 | Sato et al. .................. 372/50.11 |
| 2008/0212636 A1 | 9/2008 | Sato et al. | |
| 2008/0233017 A1 | 9/2008 | Sato et al. | |

FOREIGN PATENT DOCUMENTS

EP    17808491 A1    5/2007
JP    8-32168        2/1996

(Continued)

OTHER PUBLICATIONS

Nishiyama, Nobuhiko et al., "Single-Transverse Mode and Stable-Polarization Operation Under High-Speed Modulation of InGaAs-GaAs Vertical-Cavity Surface-Emitting Laser Grown on GaAs (311) B Substrate", *IEEE Photonics Technology Letters*, vol. 10, No. 12, pp. 1676-1678, Dec. 1998.

(Continued)

*Primary Examiner* — Minsun Harvey
*Assistant Examiner* — Patrick Stafford
(74) *Attorney, Agent, or Firm* — Cooper & Dunham LLP

(57) ABSTRACT

A vertical cavity surface emitting laser (VCSEL) includes a semiconductor substrate, a lower reflecting mirror formed on the semiconductor substrate, and a mesa structure. The mesa structure includes an active layer, a selective oxidization layer that includes a current confined structure, and an upper reflecting mirror. A lower electrode is connected to the semiconductor substrate, and an upper electrode is connected to the upper reflecting mirror. The VCSEL emits laser light perpendicularly to the plane of the semiconductor substrate when an electric current flows between the upper electrode and the lower electrode. The semiconductor substrate is inclined with respect to (100) plane. The active layer includes a quantum well layer having a compressive strain with respect to the substrate, and a spacer layer. The spacer layer has either a compressive strain or a tensile strain with respect to the semiconductor substrate.

15 Claims, 13 Drawing Sheets

FOREIGN PATENT DOCUMENTS

| | | |
|---|---|---|
| JP | 11-340570 | 12/1999 |
| JP | 11-354888 | 12/1999 |
| JP | 3551718 | 5/2004 |
| JP | 2004-281969 | 10/2004 |
| JP | 2006-13366 | 1/2006 |
| JP | 3791193 | 4/2006 |
| JP | 2007-5386 | 1/2007 |
| JP | 2007-201398 | 8/2007 |
| JP | 2008-16824 | 1/2008 |
| JP | 2008-28424 | 2/2008 |
| KR | 10-2007-0114202 | 11/2007 |
| WO | WO01/33677 A2 | 5/2001 |
| WO | WO2007/089042 | 8/2007 |

OTHER PUBLICATIONS

Ueki, Nobuaki et al., "Single-Transverse-Mode 3.4-mW Emission of Oxide-Confined 780-nm VCSEL's". *IEEE Photonics Technology Letters*, vol. 11, No. 12, pp. 1539-1541, Dec. 1999.

U.S. Appl. No. 11/993,406 of Shunichi Sato et al., filed Dec. 20, 2007.

U.S. Appl. No. 12/090,467 of Shunichi Sato et al., filed Apr. 16, 2008.

U.S. Appl. No. 12/090,934 of Akihiro Itoh et al., filed Apr. 21, 2008.

May 26, 2010 Chinese Office Action (and English translation thereof) in connection with counterpart Chinese patent application.

Jan. 11, 2011 European search report in connection with counterpart European patent application No. 09251433.

Tansu, Nelson, et al. (2001), "High-Performance Strain-Compensated InGaAs-GaAsP-GaAs ($\lambda$ = 1.17 $\mu$m). Quantum-Well Diode Lasers". IEEE Photonics Technology Letters, vol. 13, No. 3., pp. 179-181.

Matsui, Yasuhiro, et al. (2003), "Complete Polarization Mode Control of Long-Wavelength Tunable Vertical-Cavity Surface-Emitting Lasers Over 65-nm Tuning, Up to 14-mW Output Power", IEEE Journal of Quantum Electronics, vol. 39, No. 9, pp. 1037-1048.

Dec. 10, 2010 Korean official action (with English translation thereof) in connection with a counterpart Korean patent application.

\* cited by examiner

VERTICAL CAVITY SURFACE EMITTING LASER (VCSEL), VCSEL ARRAY DEVICE, OPTICAL SCANNING APPARATUS, AND IMAGE FORMING APPARATUS

BACKGROUND

1. Technical Field

The disclosure generally relates to surface emitting lasers, and more particularly to a vertical cavity surface emitting laser (VCSEL), a VCSEL array device, an optical scanning apparatus incorporating such a VCSEL array device, and an image forming apparatus incorporating such an optical scanning apparatus.

2. Description of the Related Art

A vertical cavity surface emitting laser (VCSEL) is a semiconductor laser that emits light in a direction perpendicular to a substrate on which the laser is formed. The VCSEL provides high performance at lower cost than edge-emitting semiconductor lasers, particularly when highly integrated. For this reason, VCSELs are increasingly used as a light source of choice for optical communications, optical interconnections, optical pickups, and image forming apparatuses such as laser printers. For example, IEEE PHOTONICS TECHNOLOGY LETTERS, 1999, Vol. 11, No. 12, pp. 1539-1541 ("Non-Patent Document 1") discloses a VCSEL that employs an AlGaAs material, wherein the laser has a single-mode output of 3 mW or more.

VCSELs for the aforementioned applications are required to have such characteristics as high active layer gain, low threshold current, high output, high reliability, and controlled polarization direction.

Typically, a VCSEL is formed by forming layers of semiconductor films on a GaAs substrate. Specifically, the VCSEL includes a cladding layer of AlGaAs formed on either side of a GaAs quantum well active layer, and reflecting mirrors (distributed Bragg reflectors (DBR)) made from alternate semiconductor layers of AlGaAs and AlAs films. A current confined layer is formed between the cladding layer and the reflecting mirror on the light emission side for improving performance.

However, in the VCSEL with the above structure, polarization control is difficult compared with the edge-emitting semiconductor lasers. In many cases, polarization control is dependent on unpredictable variations in the manufacturing process. Polarization may vary even on the same substrate, making it difficult to stably obtain VCSELs with constant polarization direction. It is difficult to achieve polarization stability because the VCSEL has a shorter cavity length and a larger opening for light emission than the edge-emitting laser.

When a VCSEL is used as a light source for forming an image by an image forming apparatus such as a laser printer, variations in polarization direction result in different reflectivities at a polygon mirror for optical scanning. As a result, optical utilization efficiency decreases or the image cannot be written stably. Various measures have been taken to stabilize polarization direction in VCSELs, as discussed below.

IEEE PHOTONICS TECHNOLOGY LETTERS, 1998, Vol. 10, No. 12, pp. 1676-1678 ("Non-Patent Document 2") discloses a method for controlling polarization direction in a VCSEL whereby anisotropy of the substrate, for example, is utilized. Specifically, the method involves controlling the polarization direction to (−233) direction by using an inclined (311)B substrate.

Japanese Laid-Open Patent Application No. 2008-28424 ("Patent Document 1") discloses a method for controlling polarization by providing anisotropy to a mesa structure in a VCSEL. Japanese Patent No. 3791193 ("Patent Document 2") discloses a polarization control method utilizing the direction in which wire leads are drawn out. Japanese Laid-Open Patent Application No. 2008-16824 ("Patent Document 3") discloses a polarization control method involving the application of a stress to the active layer by locally providing an oxidization region inside a VCSEL.

Japanese Laid-Open Patent Applications No. 11-340570 ("Patent Document 4") and 11-354888 ("Patent Document 5") disclose multi-beam semiconductor lasers in which, in order to meet the demand for higher speed in image forming apparatus such as laser printers, multiple light sources are provided on a single chip.

Japanese Laid-Open Patent Application No. 2002-217492 ("Patent Document 6") discloses a method for forming an active layer on a substrate, wherein a relaxation layer is provided between the active layer and the substrate, the relaxation layer having an intermediate lattice constant between the active layer and the substrate, so that a high-quality active layer can be formed.

Japanese Laid-Open Patent Application No. 2003-347582 ("Patent Document 7") discloses a method for forming a DBR on a substrate using AlInP/GaInP such that the lattice constant gradually varies, in order to form a high-quality active layer.

In the method according to Non-Patent Document 2, the substrate is inclined at 25°. As the inclination of the substrate increases, isotropic oxidation becomes increasingly difficult when forming an oxidized confined layer, thus leading to increased manufacturing difficulties. Further, such substrates are special substrates and are very expensive, making it difficult to manufacture the VCSEL at low cost.

In the method of Patent Document 1 the anisotropy of the mesa structure is reflected in the current confined region. In this case, current injection homogeneity may be lost, or a desired spot shape may not be obtained from the manufactured laser. In addition, in the method of Patent Document 1, the mesa structure anisotropy also affects the process of forming the current confined region in the VCSEL, so that uniform current injection is difficult.

In the method according to Patent Document 2, when the VCSEL is integrated at high density within a single chip, the intervals of the individual elements become narrower, thus making it difficult to form wires freely. If the intervals among the individual elements are increased for the sake of wiring, the area of the individual chip increases, resulting in an increased manufacturing cost.

In the method according to Patent Document 3, the structure of the VCSEL requires an additional manufacturing step, so that the manufacturing process becomes more complex and requires a longer manufacturing time, resulting in increased manufacturing cost. Further, the current confined layer is made of AlOx obtained by oxidizing AlAs, which produces a strain around the confined layer. As a result, dislocation is caused upon energization, resulting in a possible decrease in reliability. Thus, it is not preferable to provide a plurality of such current confined layers.

The multi-beam semiconductor lasers according to Patent Documents 4 and 5 are edge-emitting semiconductor lasers, wherein there is the problem of thermal interference between individual elements and it is difficult to obtain narrow pitches of several μm or less on the structure when the elements are arrayed one-dimensionally.

In the structure disclosed in Patent Document 6, the active layer has a greatly different lattice constant from the substrate. Although the relaxation layer with the intermediate lattice constant is provided between the substrate and the active layer, the presence of the layer with a large strain near the active layer strains the active layer, making it difficult to obtain high quality.

In the structure according to Patent Document 7, the lattice constant of the DBR between the substrate and the active layer is gradually changed in order to allow the formation of the active layer having a greatly different lattice constant from the substrate. Thus, the difference in lattice constant between the DBR near the active layer and the lattice constant of the active layer is smaller than in Patent Document 6. However, given the thickness of a DBR which is typically on the order of several μm, the stress applied to the active layer is large. Thus, it is difficult to obtain a high-quality active layer as in the case of Patent Document 6.

Thus, the conventional laser light sources cannot sufficiently cope with the increased speeds in image forming apparatuses such as, for example, laser printers.

BRIEF SUMMARY

In an aspect of this disclosure, there is provided a vertical cavity surface emitting laser (VCSEL) including a semiconductor substrate; a lower reflecting mirror formed on a surface of the semiconductor substrate by alternately forming layers of semiconductor films having different refraction indexes on the surface of the semiconductor substrate; an active layer formed on the lower reflecting mirror from a semiconductor material; a selective oxidization layer formed on the active layer that is partially oxidized, forming a current confined structure; and an upper reflecting mirror formed on the selective oxidization layer by alternately forming layers of semiconductor films having different refraction indexes.

A mesa structure is formed in at least the active layer, the selective oxidization layer, and the upper reflecting mirror. The VCSEL further includes a lower electrode connected to the semiconductor substrate; and an upper electrode connected to the upper reflecting mirror.

The VCSEL emits laser light perpendicularly to the plane of the semiconductor substrate when an electric current flows between the upper electrode and the lower electrode. The semiconductor substrate is inclined with respect to a particular plane. The active layer includes a quantum well layer having a compressive strain with respect to the substrate, and a spacer layer. The spacer layer has a specific strain with respect to the semiconductor substrate.

According to another aspect, a VCSEL array device includes a plurality of the aforementioned VCSELs arranged on a semiconductor substrate.

According to another aspect of the disclosure, an optical scanning apparatus for scanning a scanned surface with a light beam includes a light source unit; a deflecting unit configured to deflect a light beam emitted by the light source unit; and a scanning optical system configured to focus the light beam deflected by the deflecting unit on the scanned surface. The light source unit includes the above VCSEL array device.

BRIEF DESCRIPTION OF THE DRAWINGS

The aforementioned and other aspects, advantages and features are described in conjunction with the accompanying drawings in which.

DETAILED DESCRIPTION OF THE PREFERRED EMBODIMENTS

Figure 1A:
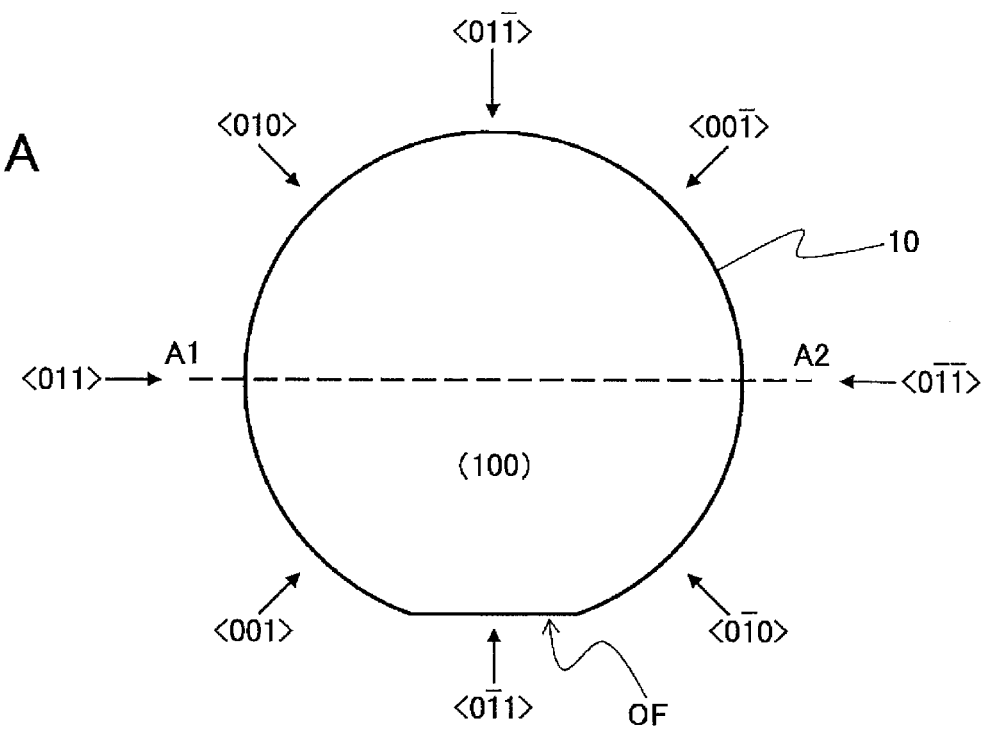
FIG. 1A is a plan view of an n-GaAs substrate that is not inclined.

Hereafter, embodiments of the present invention are described with reference to the drawings wherein like reference numerals designate identical or corresponding parts throughout the several views.

First Embodiment

Figure 1B:
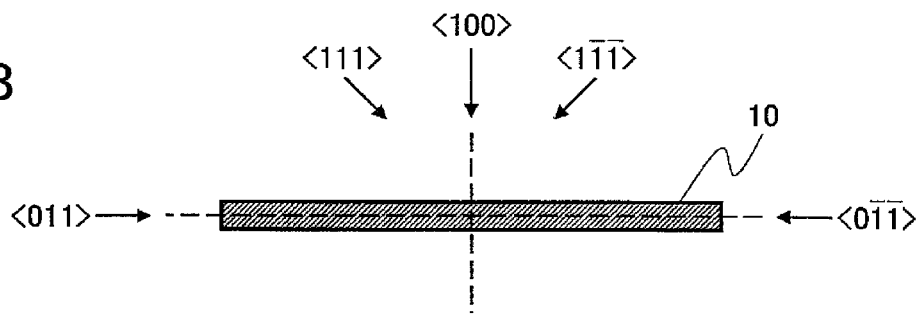
FIG. 1B is a cross section of the n-GaAs substrate taken along a broken line A1-A2 of FIG. 1A.

A vertical cavity surface emitting laser (VCSEL) according to the first embodiment of the present invention includes a current confined structure. FIG. 1A shows a plan view of an n-GaAs substrate 10 that is not inclined. FIG. 1B shows a cross section taken along broken line A1-A2 in FIG. 1A. As shown in FIGS. 1A and 1B, the surface of the n-GaAs substrate 10 is the principal surface (100) that is not inclined.

Figure 1C:
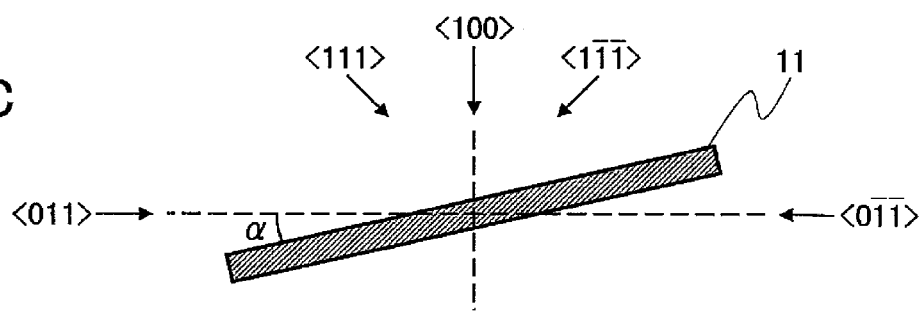
FIG. 1C is a cross section of an n-GaAs substrate according to a first embodiment of the present invention that is inclined.

FIG. 1C shows a cross section of an n-GaAs semiconductor substrate 11 that is inclined with respect to the (100) plane toward (011) direction by an angle α of 15°. The inclination angle may generally be 2 to 20°. By thus using the inclined substrate, a gain difference is produced in the active layer between the inclined direction and a direction perpendicular to the inclined direction, making it easier to control polarization direction to a certain direction.

Figure 2:
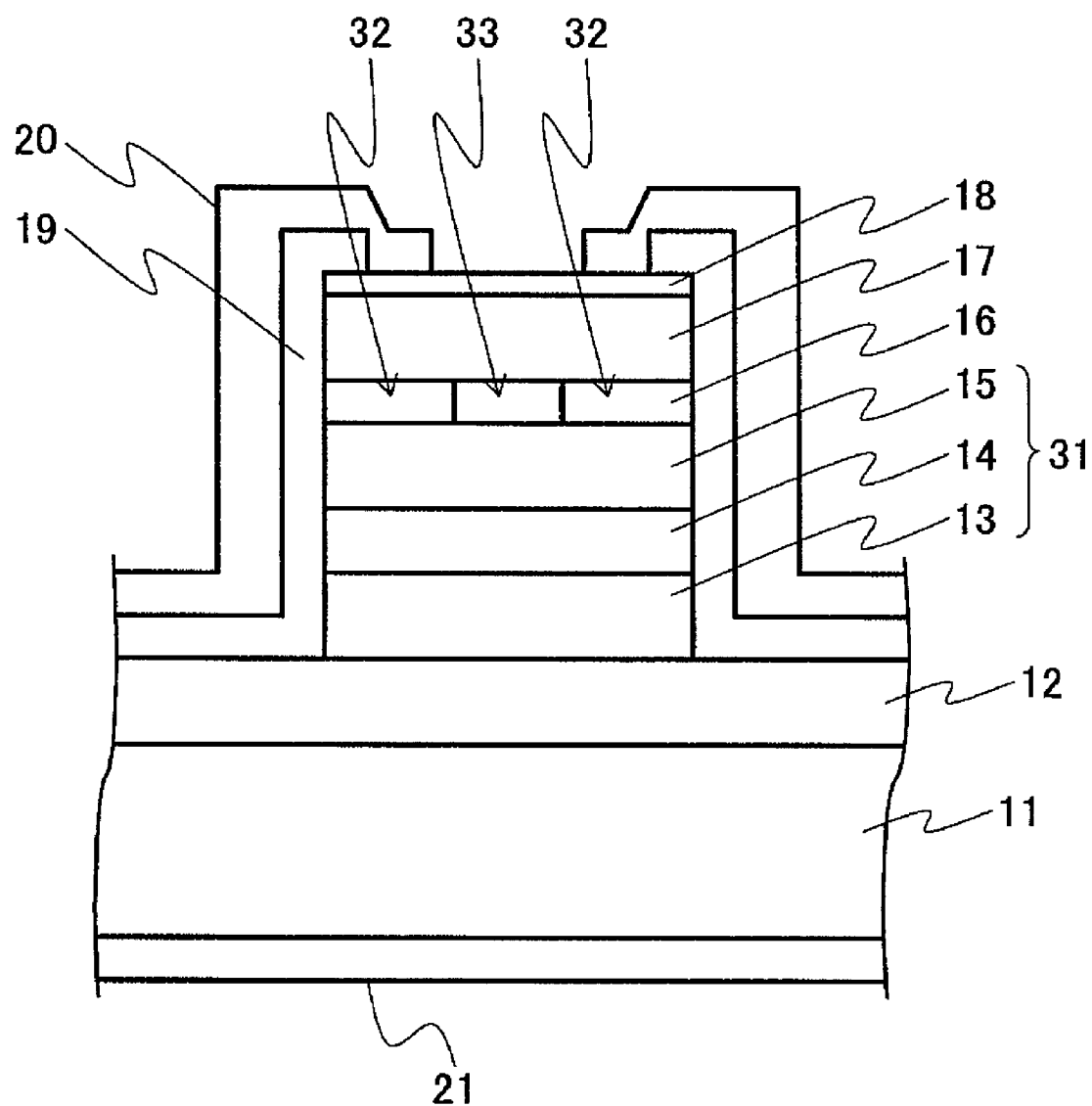
FIG. 2 is a cross section of a VCSEL according to the first embodiment of the present invention.

With reference to FIG. 2, the structure of the VCSEL according to the first embodiment is described. The VCSEL according to the present embodiment includes the inclined n-GaAs semiconductor substrate 11. On the inclined n-GaAs semiconductor substrate 11, a lower reflecting mirror 12 is formed by alternately forming layers of semiconductor films with high and low refraction indexes. On top of the lower reflecting mirror 12, there is formed a lower spacer layer 13, on which there is further formed a multiple quantum well layer 14. On the multiple quantum well layer 14, an upper spacer layer 15 is formed. On the upper spacer layer 15, there is formed a selective oxidization layer 16, on which there is further formed an upper reflecting mirror 17. The upper reflecting mirror 17 is formed by alternately forming layers of semiconductor films with high and low refraction indexes. A contact layer 18 is further formed on the upper reflecting mirror 17.

In accordance with the present embodiment, the lower spacer layer 13, the multiple quantum well layer 14, and the upper spacer layer 15 constitute an active layer 31. The multiple quantum well layer 14 has a strain that is compressive with respect to the semiconductor substrate 11.

After the individual layers are thus formed, a mesa structure is formed in the stack of the lower spacer layer 13, the multiple quantum well layer 14, the upper spacer layer 15, the selective oxidization layer 16, the upper reflecting mirror 17, and the contact layer 18. Thereafter, the selective oxidization layer 16 is selectively oxidized to form a peripheral oxidized region (oxidization region) 32 and a central non-oxidized region (current confined region) 33. Specifically, in the oxidization region 32, an insulator of AlxOy is formed, thus forming a current confined structure such that, when current flows through the element, the current flows through the confined region 33 in a concentrated manner.

Thereafter, a protection film 19 is formed to cover the mesa structure, followed by the formation of an upper electrode 20 connected to the contact layer 18 and a lower electrode 21 on a back surface of the semiconductor substrate 11.

In this VCSEL, when current flows between the upper electrode 20 and the lower electrode 21, the current is injected into the active layer 31, whereby a state of inverted distribution is formed, emitting light. The light produced in the active layer 31 is amplified between the lower reflecting mirror 12 and the upper reflecting mirror 17, and is then emitted perpendicularly to the semiconductor substrate 11.

The polarization direction of the thus emitted laser light easily varies due to the aforementioned variations in manufacturing process, for example. The inventors discovered that the polarization direction can be stabilized by using the semiconductor substrate 11 with an inclined principal surface, providing the multiple quantum well layer 14 with a compressive strain with respect to the semiconductor substrate 11, and providing a certain strain in each of the lower spacer layer 13 and the upper spacer layer 15.

Figure 3:
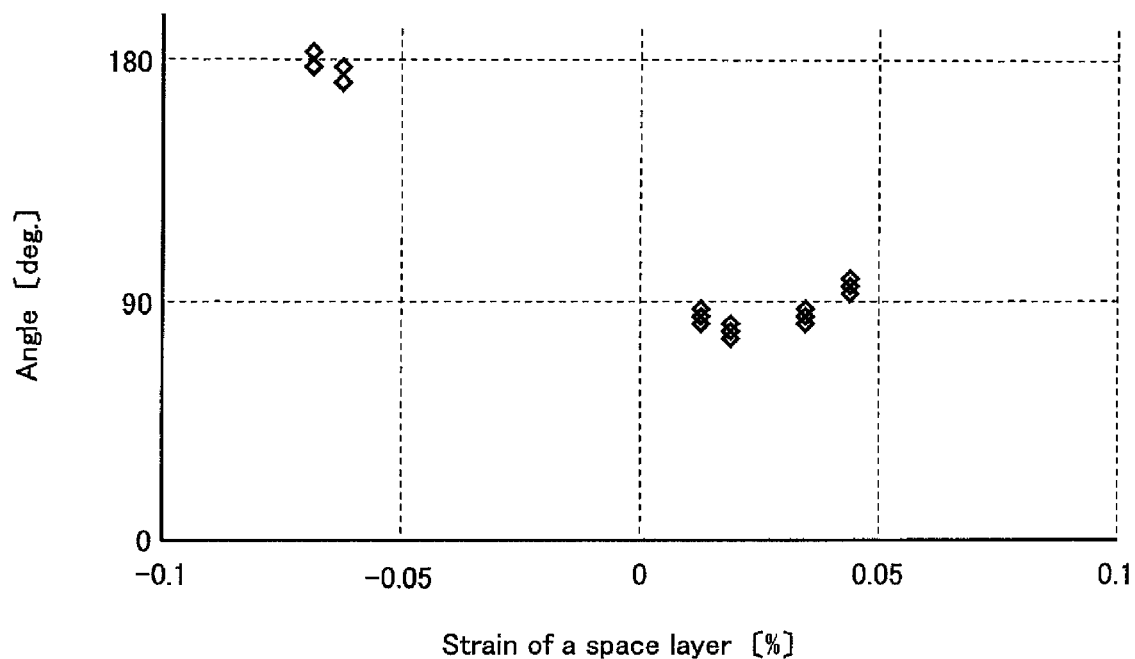
FIG. 3 shows a plot of the polarization angle versus the strain in a spacer layer with respect to the semiconductor substrate.

Specifically, the inventors discovered that, when the upper spacer layer 13 and the lower spacer layer 15 are formed of an AlGaInPAs material including at least In and P, i.e., InP to which one or more of Al, Ga, and As is added, the polarization angle becomes 90° by providing a compressive strain in the upper spacer layer 13 and the lower spacer layer 15 with respect to the semiconductor substrate 11, where the value of the strain of the spacer layer in FIG. 3 is positive. Thus, a constant polarization direction can be obtained regardless of the amount of the compressive strain.

The "strain" is herein intended to refer to a ratio of the lattice constant of the material of the individual films to the lattice constant of the semiconductor substrate. A film having a larger lattice constant than the lattice constant of the semiconductor substrate has a compressive strain, so that the value of the strain of the spacer layer in FIG. 3 is positive. A film having a smaller lattice constant than the lattice constant of the semiconductor substrate has a tensile strain, where the value of the strain of the spacer layer in FIG. 3 is negative. In accordance with the present embodiment, the multiple quantum well layer 14 has the compressive strain of +0.7%.

Although the present embodiment the semiconductor substrate 11 is inclined with respect to (100) plane, the same effects may be obtained with the semiconductor substrate inclined with respect to (010) or (001) plane. In another embodiment, a single quantum well layer may be employed rather than the multiple quantum well layer 14.

In accordance with the present embodiment, the polarization angle is 90 when the lower spacer layer 13 and the upper spacer layer 15 each have a compressive strain, as shown in FIG. 3. However, the polarization angle may be 180° when the compressive strain in the multiple quantum well layer 14 is large, for example. This is presumably due to the fact that as the compressive strain increases, the difference between the lattice constant of the semiconductor substrate 11 and that of the multiple quantum well layer 14 becomes large, resulting in a different state of lattice matching. In this case, too, a stable polarization angle, although it may be 180°, can be obtained as long as the multiple quantum well layer 14 has a compressive strain with respect to the semiconductor substrate 11, and the lower spacer layer 13 and the upper spacer layer 15 are made of InP to which one or more of Al, Ga, and As is added and each have a compressive strain with respect to the semiconductor substrate 11.

In accordance with the present embodiment, although the inclination angle of the semiconductor substrate is 15°, polarization direction is controlled based on not just the inclination angle of the substrate but also on the combination of the amounts of strain in the spacer layer and the multiple quantum well layer. Thus, process difficulty can be reduced compared with cases where the inclination angle is higher, such as in Non-Patent Document 2. Furthermore, because the 15° inclined substrate is widely used as a substrate for laser diodes for DVD's, the substrate is relatively inexpensive.

When a substrate with an inclination angle smaller than 15° is used, equivalent effects can be obtained by setting the value of the strain in the spacer layers and the multiple quantum well layer higher. Conversely, if an inclination of more than 15° is made possible by improvements in VCSEL manufacturing process, an extremely high polarization stability may be obtained by using a substrate with higher inclination angles.

The polarization control method according to the present embodiment involving the combination of the substrate inclination angle and the spacer/quantum well strain can be used in combination with the polarization control method according to Patent Document 1, which is based on the mesa structure anisotropy. Thus, the effects of the present embodiment can be obtained while reducing the disadvantages of the individual methods.

While in Patent Document 6 the strain relaxation layer is provided between the substrate and the quantum well, it is difficult to obtain a high-quality active layer because of the large difference in lattice constant between the substrate and the quantum well. In accordance with the present embodiment, the difference in lattice constant between the substrate and the spacer layer is small, so that a high-quality active layer can be formed without applying a large strain to the active layer.

In the case of Patent Document 7, the lattice constant in the DBR between the substrate and the active layer is gradually changed. Thus, although the difference in lattice constant between the active layer and the layer adjacent to the active layer is slight, a large stress is applied to the active layer due to the thickness of the strained layers, which is on the order of several μm, making it difficult to obtain a high-quality active layer. However, in accordance with the present embodiment, the difference in lattice constant between the substrate and the spacer layer is small, and the film thickness of the spacer layer is on the order of several hundred nm. Thus, a high-quality active layer can be formed without subjecting the active layer to a large strain.

The VCSEL according to the present embodiment allows for the formation of a two-dimensional array, where the element intervals can be set as desired. Thus, the number of light-emitting elements that can be integrated on a single chip can be increased compared with edge-emitting semiconductor lasers.

Second Embodiment

In accordance with the second embodiment of the present invention, a VCSEL includes a polarization control layer. The VCSEL is described with reference to FIGS. 2 and 4.

Figure 4:
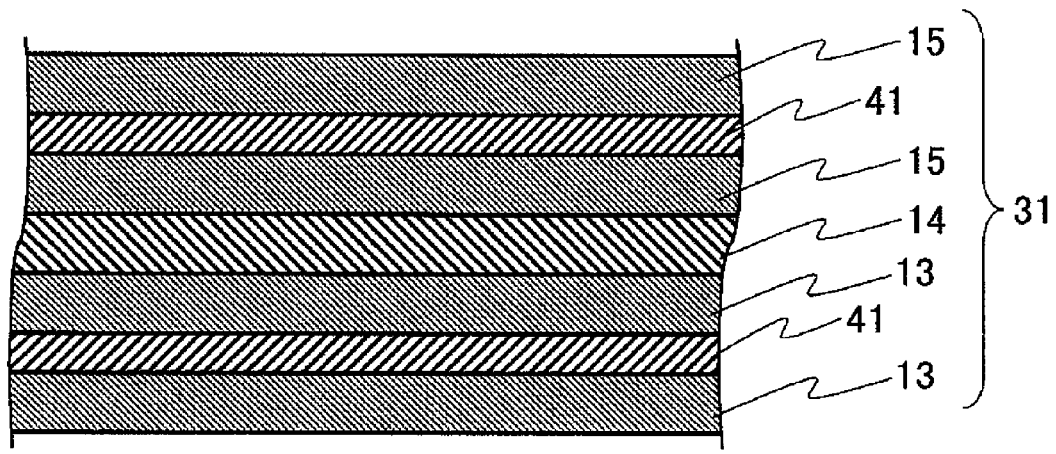
FIG. 4 is a cross section of an active layer of a VCSEL according to a second embodiment of the present invention.

The VCSEL according to the present embodiment has the structure shown in FIG. 2 wherein the active layer 31 has a structure shown in FIG. 4. Specifically, the VCSEL includes the semiconductor substrate 11 with the inclined principal surface; the multiple quantum well layer 14 having a compressive strain with respect to the semiconductor substrate 11; and the lower spacer layer 13 and the upper spacer layer 15 in each of which a polarization control layer 41 is provided. In accordance with the second embodiment, the following is satisfied:

$$(ea \times ta + eb \times tb)/(ta + tb) > 0 \quad (1)$$

where ea is the lattice strain in the lower spacer layer 13 and the upper spacer layer 15; ta is the total film thickness of the lower spacer layer 13 and the upper spacer layer 15; eb is the lattice strain in each polarization control layer 41; and tb is the total film thickness of the individual polarization control layers 41. The left part of the expression (1), i.e., (ea×ta+eb×tb)/(ta+tb), may be hereafter simply referred to as E.

When the expression (1) is satisfied, the polarization angle is stable at around 90° with respect to the (0-11) surface of the semiconductor substrate as in the case of FIG. 3, so that the VCSEL has a constant polarization angle. While FIG. 4 shows the polarization control layer 41 being provided in each of the lower spacer layer 13 and the upper spacer layer 15, the polarization control layer 41 may be formed in either the lower spacer layer 13 or the upper spacer layer 15 as shown in FIG. 5, as long as the expression (1) is satisfied.

Although the lower spacer layer 13 and the upper spacer layer 15 are made of GaInPAs, the polarization control layer 41 is made of an AlGaInP material including at least In and P, i.e., InP to which one or more of Al, Ga, and As is added. In this way, a higher bandgap can be obtained in the polarization control layer 41. Thus, when the lower spacer layer 13 and the upper spacer layer 15 are made of a material with a low bandgap, an improved electron-confining efficiency can be obtained.

Figure 5:
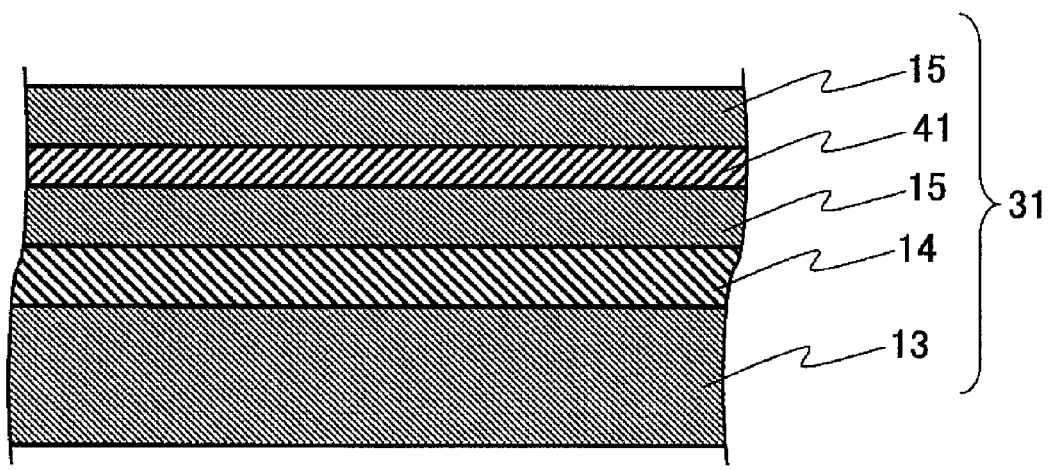
FIG. 5 is a cross section of another example of the active layer of the VCSEL according to the second embodiment.
Figure 6:
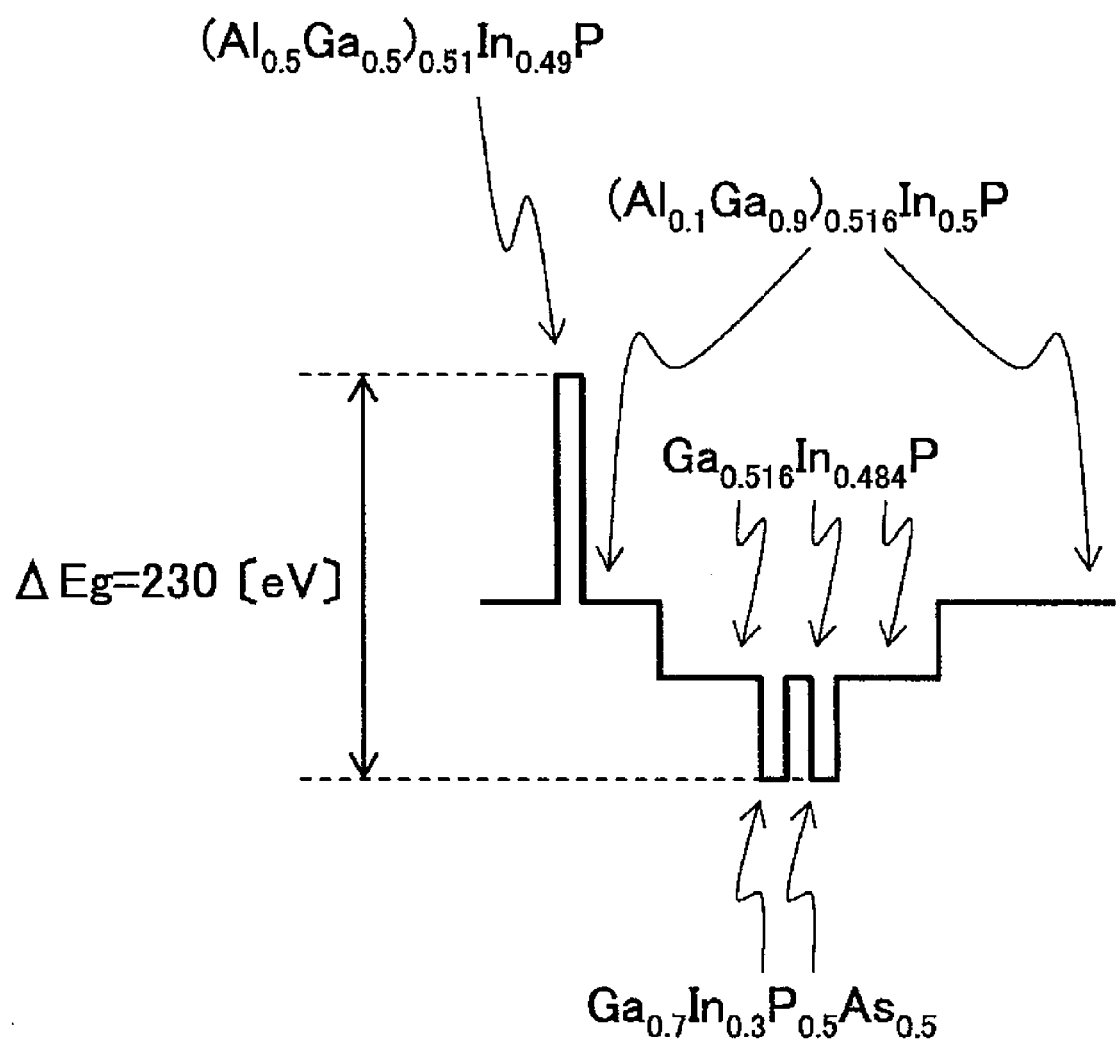
FIG. 6 shows the band structure of the active layer shown in FIG. 5.

FIG. 6 shows the band structure of the active layer 31 shown in FIG. 5. The multiple quantum well layer 14 is formed of quantum well layers of $Ga_{0.7}In_{0.3}P_{0.5}As_{0.5}$ having the strain of +0.7%, and barrier layers of $Ga_{0.516}In_{0.484}P$ having the strain of 0%. The lower spacer layer 13 and the upper spacer layer 15 are formed of $(Al_{0.1}Ga_{0.9})_{0.516}In_{0.484}P$ with the strain of 0%. The polarization control layer 41 is formed of $(Al_{0.5}Ga_{0.5})_{0.51}In_{0.49}P$ having the strain of +0.04%. In this case, the value of the left part of the expression (1) is +0.03%. Because the polarization control layer 41 is formed of $(Al_{0.5}Ga_{0.5})_{0.51}In_{0.49}P$ having the wide bandgap, improved light and electron confining efficiency can be obtained.

Third Embodiment

In accordance with the third embodiment of the present invention, a VCSEL array device includes an array of VCSELs according to an embodiment of the present invention.

Figure 7:
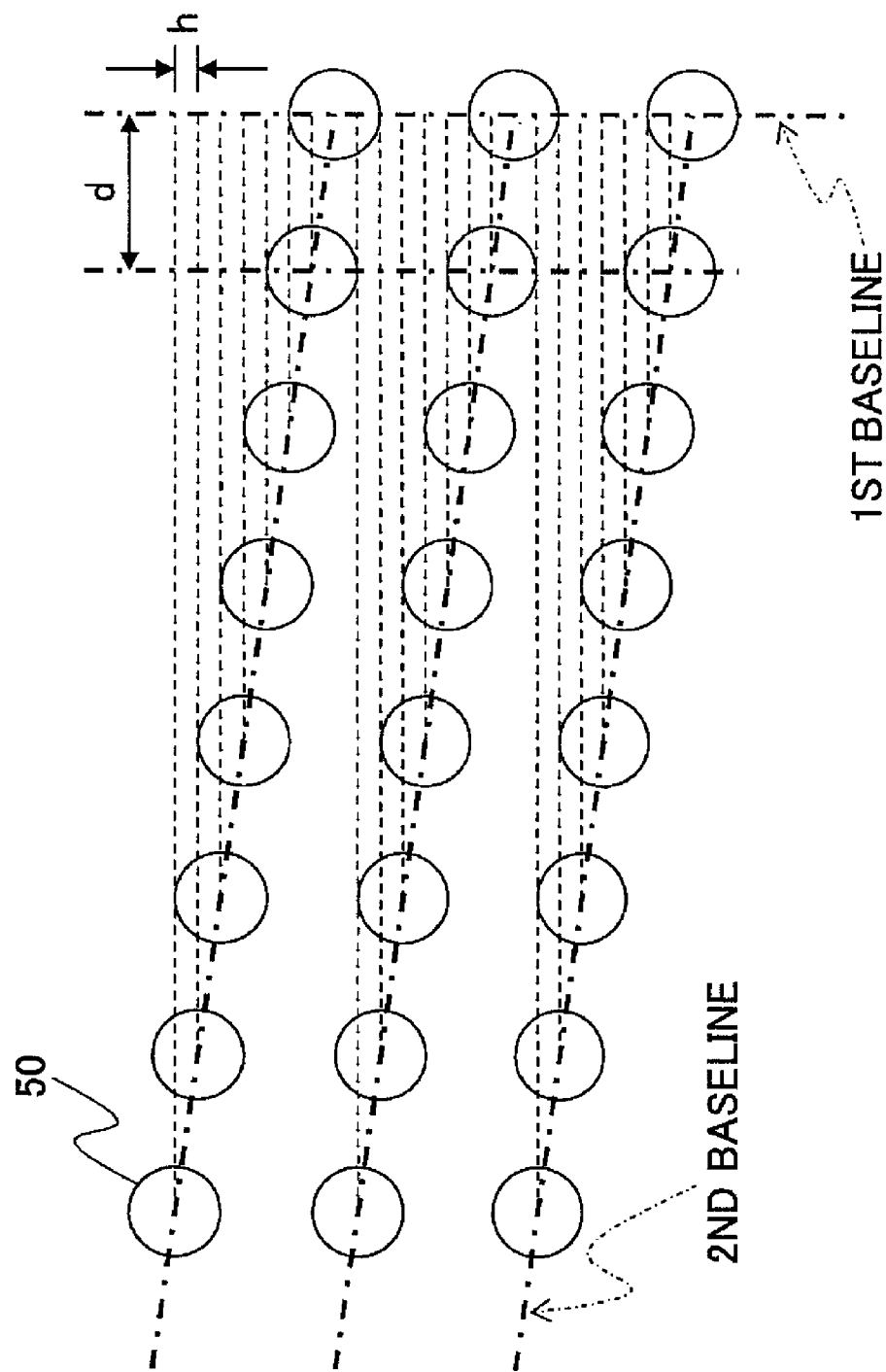
FIG. 7 schematically shows a VCSEL array device according to a third embodiment of the present invention.

Referring to FIG. 7, the VCSEL array device includes VCSELs 50 arranged two-dimensionally along first baselines and second baselines. Along each of the second baselines, the VCSELs 50 are arranged at intervals d perpendicularly to the first baselines. When the positions of the VCSELs 50 are projected on the first baselines, the VCSELs 50 are arranged at intervals h.

When the VCSEL array device according to the third embodiment is used in an image forming apparatus such as a laser printer, light is emitted perpendicularly to the first baselines, so that a very fine image can be formed.

Fourth Embodiment

In accordance with the fourth embodiment of the present invention, an optical scanning apparatus 100 includes the VCSEL array device according to the third embodiment as a light source. The optical scanning apparatus 100 is described with reference to FIG. 8.

Figure 8:
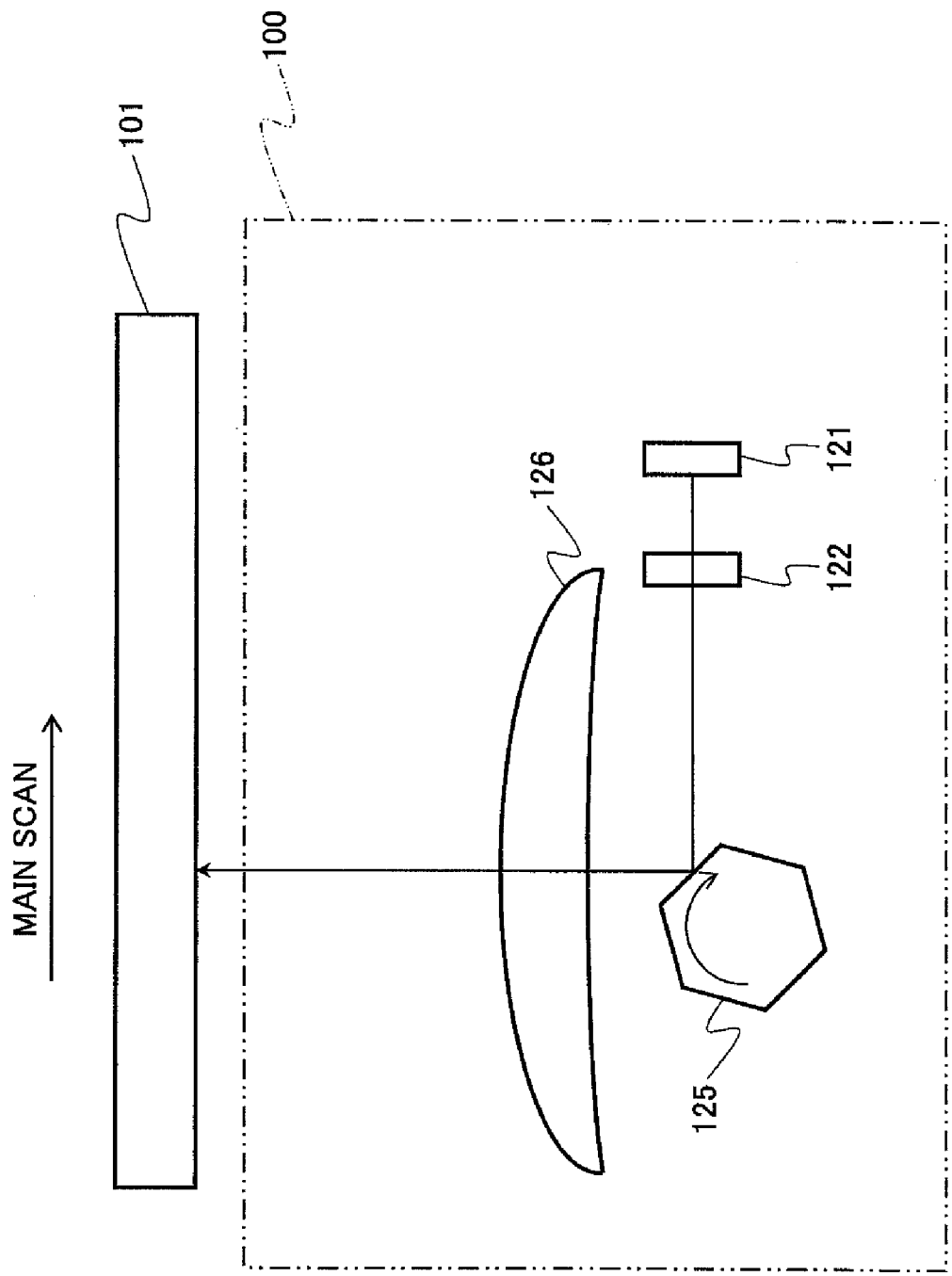
FIG. 8 schematically shows an optical scanning apparatus according to a fourth embodiment of the present invention.

The optical scanning apparatus 100 includes a light source unit 121, a collimator lens 122, a polygon mirror 125, and an fθ lens 126. In FIG. 8, the horizontal direction of the drawing sheet corresponds to the main scan direction and the vertical direction corresponds to the sub-scan direction.

The light source unit 121 includes the VCSEL array device according to the third embodiment. The collimator lens 122 is configured to make a light beam emitted from the light source unit 121 into substantially parallel light. The light beam from the collimator lens 122 is reflected by a rotating polygon mirror 125, and then collected on a surface of the photosensitive drum 101 as an optical spot by the fθ lens 126. The polygon mirror 125 is rotated by a motor (not shown) at a constant velocity. Thus the light beam is deflected at a constant angular velocity, and the optical spot on the surface of the photosensitive drum 101 moves in the main scan direction at a constant velocity.

In accordance with the present embodiment, the polarization angles of the individual VCSELs in the VCSEL array device in the light source unit 121 are aligned, so that the polygon mirror 125 reflects with a uniform reflectivity. Thus, an image forming apparatus incorporating the optical scanning apparatus of the present embodiment is capable of forming a fine image.

Fifth Embodiment

In accordance with the fifth embodiment of the present invention, a laser printer as an image forming apparatus includes the optical scanning apparatus according to the fourth embodiment.

Figure 9:
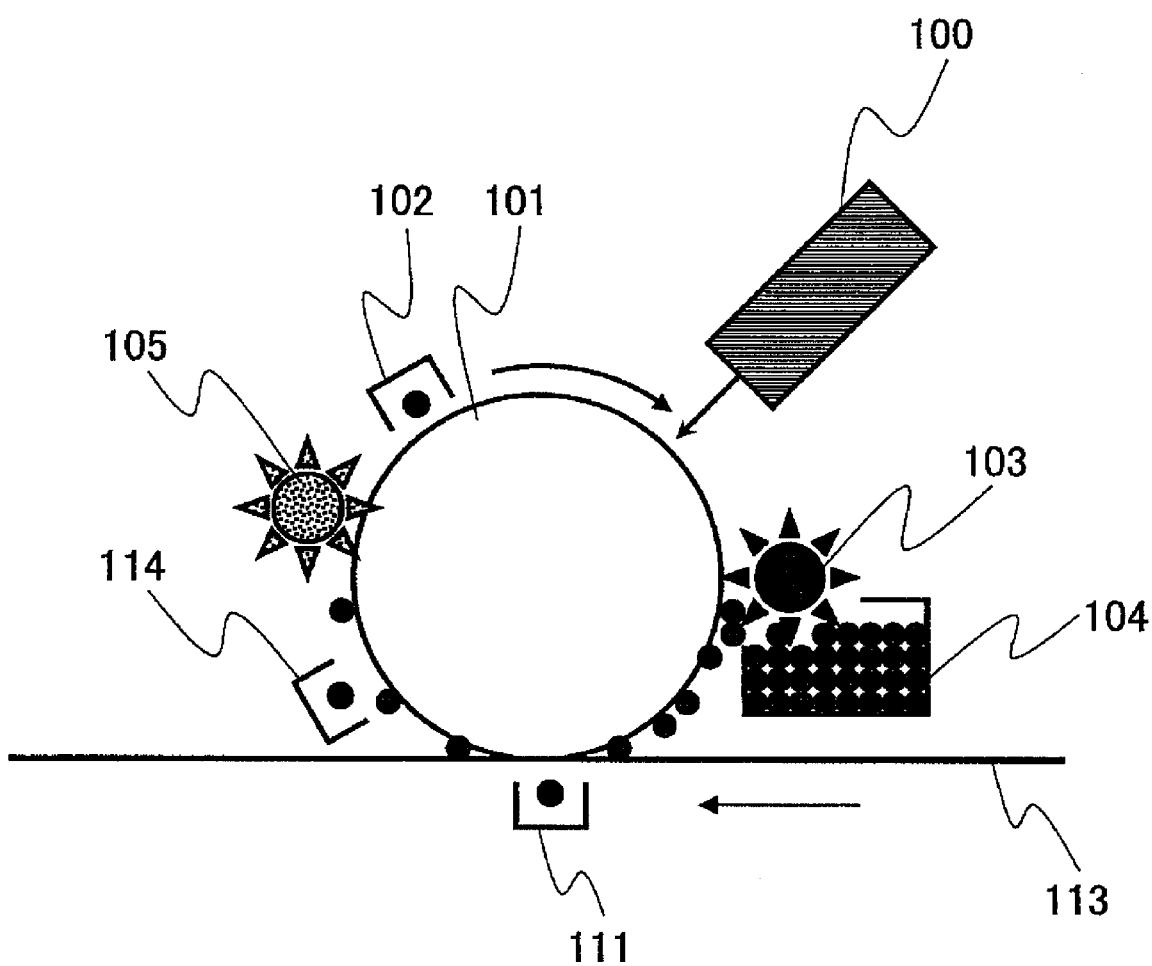
FIG. 9 schematically shows an image forming apparatus according to a fifth embodiment of the present invention.

With reference to FIG. 9, the laser printer according to the fifth embodiment is described. The laser printer includes the optical scanning apparatus 100, a photosensitive drum 101, a charging unit 102, a developing unit 103, a toner cartridge 104, a cleaning unit 105, a transfer unit 111, and a neutralizing unit 114.

On a surface of the photosensitive drum 101, a photosensitive layer is formed. The photosensitive drum 101 is rotated in clockwise direction, as shown in FIG. 9. The charging unit 102 is configured to uniformly charge the surface of the photosensitive drum 101.

The optical scanning apparatus 100 irradiates the surface of the photosensitive drum 101 that has been charged by the charging unit 102 with light. The optical irradiation produces a latent image on the surface of the photosensitive drum 101 that corresponds to desired image information. The region of the photosensitive drum surface where the latent image is then formed is moved toward the developing unit 103 as the photosensitive drum 101 rotates.

The toner cartridge 104 contains toner that is supplied to the developing unit 103. The developing unit 103 causes the toner to attach to the latent image on the surface of the photosensitive drum 101, thus developing the latent image. Thereafter, the photosensitive drum 101 further rotates and the developed latent image on the surface of the photosensitive drum 101 is transported to the transfer unit 111.

The transfer unit 111 is supplied with charges of the opposite polarity to that of the toner on the surface of the photosensitive 101 so that the toner on the surface of the photosensitive drum 101 can be electrically drawn toward the recording sheet 113. Namely, the charges cause the toner on the surface of the photosensitive drum 101 to be transferred to the recording sheet 113, thus transferring the developed image onto the recording sheet 113.

The neutralizing unit 114 is configured to neutralize the surface of the photosensitive drum 101 after image formation. The cleaning unit 105 removes the toner (residual toner) remaining on the surface of the photosensitive drum 101 after image formation. The removed residual toner may be recycled. The surface of the photosensitive drum 101 from which the residual toner has been removed is again moved toward the charging unit 102.

Sixth Embodiment (Color Image Forming Apparatus)

Figure 10:
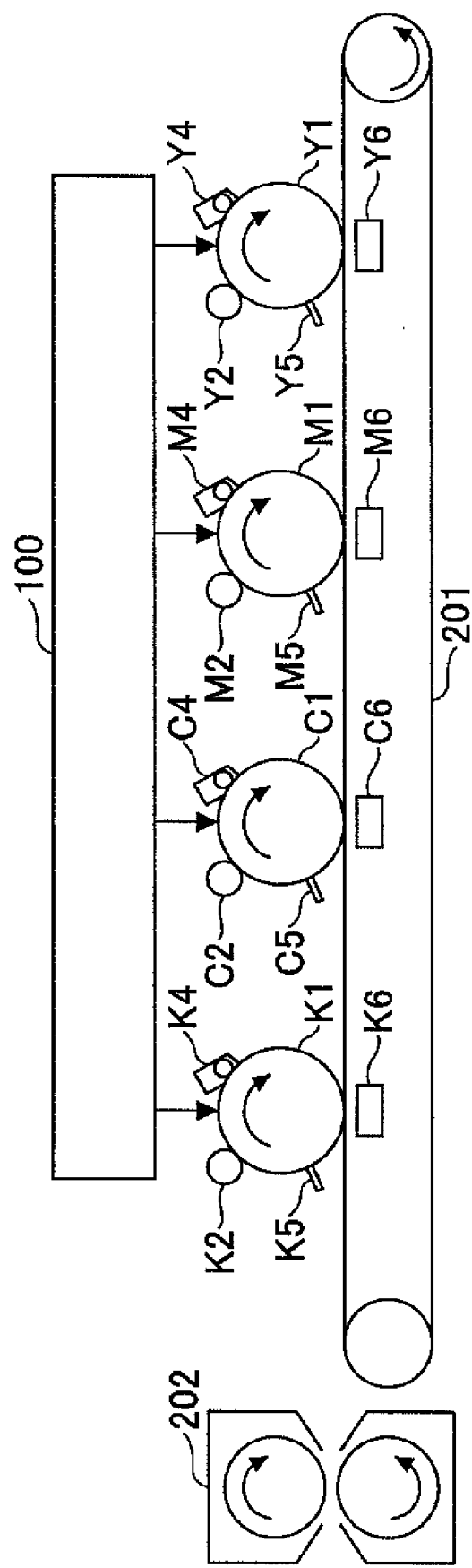
FIG. 10 schematically shows a color laser printer according to a sixth embodiment of the present invention.

In accordance with the sixth embodiment, the present invention provides a color laser printer as an image forming apparatus for forming a color image. The color laser printer is described with reference to FIG. 10.

The color laser printer according to the present embodiment is a tandem color machine having a plurality of photosensitive drums for printing a color image. Specifically, the color laser printer includes a photosensitive drum K1, a charger K2, a developer K4, a cleaning unit K5, and a transfer charging unit K6 for black (K); a photosensitive drum C1, a charger C2, a developer C4, a cleaning unit C5, and a transfer charging unit C6 for cyan (C); a photosensitive drum M1, a charger M2, a developer M4, a cleaning unit M5, and a transfer charging unit M6 for magenta (M); and a photosensitive drum Y1, a charger Y2, a developer Y4, a cleaning unit Y5, and a transfer charging unit Y6 for yellow (Y). The color laser printer also includes the optical scanning apparatus 100 according to the fifth embodiment, a transfer belt 201, and a fusing unit 202.

The optical scanning apparatus 100 in the color laser printer includes semiconductor lasers for black, cyan, magenta, and yellow. Each of these semiconductor lasers comprises the VCSEL according to an embodiment of the present invention.

The photosensitive drum K1 for black is irradiated with a light beam from the semiconductor laser for black. The photosensitive drum C1 for cyan is irradiated with a light beam from the semiconductor laser for cyan. Similarly, the photosensitive drum M1 is irradiated with a light beam from the semiconductor laser for magenta, and the photosensitive drum Y1 is irradiated with a light beam from the semiconductor laser for yellow.

Each of the photosensitive drums K1, C1, M1, and Y1 rotates in the direction indicated by an arrow, along which there are arranged the charger K2, C2, M2, or Y2, the developer K4, C4, M4, or Y4, the transfer charging unit K6, C6, M6, or Y6, and the cleaning unit K5, C5, M5, or Y5. The charger K2, C2, M2, or Y2 charges the surface of the corresponding photosensitive drum K1, C1, M1, or Y1 uniformly. The charged surface of each of the photosensitive drums K1, C1, M1, and Y1 is irradiated with the light beam emitted by the optical scanning apparatus 100, whereby an electrostatic latent image is formed on the surface of each of the photosensitive drums K1, C1, M1, and Y1.

Thereafter, a toner image is formed on the surface of each of the photosensitive drums K1, C1, M1, and Y1 by the respective developer K4, C4, M4, or Y4. The toner images of the individual colors are then transferred onto a recording sheet by the corresponding transfer charging units K6, C6, M6, and Y6, followed by fusing of the image on the recording sheet by the fusing unit 202. The residual toner that remains on the surface of the photosensitive drum K1, C1, M1, or Y1 is removed by the corresponding cleaning unit K5, C5, M5, or Y5.

While the present embodiment employs the photosensitive drums as image carriers, a silver halide film may be used as the image carrier. In this case, the latent image may be formed on the silver halide film by an optical scan, and then developed in a manner well known in the conventional silver halide photography process. The developed latent image may then be transferred onto a printing paper by a process similar to the printing process in the conventional silver halide photography process.

The image forming apparatus according to the sixth embodiment may be used as an optical plate-making apparatus, or an optical image producing apparatus for producing images such as CT scan images.

The image carrier may also comprise a color producing medium (such as positive printing paper) that develops colors upon application of thermal energy from a beam spot. In this case, a visible image can be directly formed on the image carrier by an optical scan.

Seventh Embodiment

In accordance with the seventh embodiment of the present invention, a vertical cavity surface emitting laser (VCSEL) structure includes a current confined structure. The structure of the VCSEL according to the seventh embodiment is basically identical to the first embodiment shown in FIG. 2.

Specifically, the inventors discovered that, when the upper spacer layer 13 and the lower spacer layer 15 are formed of an AlGaInPAs material, i.e., InP to which one or more of Al, Ga, and As is added, the polarization angle becomes 180° by providing a tensile strain in the upper spacer layer 13 and the lower spacer layer 15 with respect to the semiconductor substrate 11, where the value of the strain of the space layer in FIG. 3 is negative. Thus, a constant polarization direction can be obtained regardless of the amount of the tensile strain.

The "strain" is herein intended to refer to a ratio of lattice constants of the materials of the individual films to the lattice constant of the semiconductor substrate. A film having a larger lattice constant than the lattice constant of the semiconductor substrate has a large compressive strain, so that the value of the strain of the spacer layer in FIG. 3 is positive. A film having a smaller lattice constant than the lattice constant of the semiconductor substrate has a tensile strain, where the value of the strain of the spacer layer in FIG. 3 is negative. In accordance with the present embodiment, the multiple quantum well layer 14 has a compressive strain of +0.7%.

Although the present embodiment employs the semiconductor substrate 11 inclined with respect to (100) plane, the same effects can be obtained with the semiconductor substrate inclined with respect to (010) or (001) plane.

In accordance with the present embodiment, the inclination angle of the semiconductor substrate, i.e., 15°, is controlled based on not just the inclination angle of the substrate but also on the combination of the amounts of strain in the spacer layer and the multiple quantum well layer. Thus, process difficulty can be reduced compared with cases where the inclination angle is higher, such as in Non-Patent Document 2. Furthermore, because the 15° inclined substrate is widely used as a substrate for laser diodes for DVD's, the substrate is relatively inexpensive.

When a substrate with an inclination angle smaller than 15° is used, equivalent effects can be obtained by setting the value of the strain in the spacer layer and the multiple quantum well layer higher. Conversely, if an inclination of more than 15° is made possible by improvements in the manufacturing process for the VCSEL, an extremely high polarization stability may be obtained.

The polarization control method according to the present embodiment involving the combination of the substrate inclination angle and the spacer/quantum well strain can be used in combination with the polarization control method according to Patent Document 1 which is based on the mesa structure anisotropy. Thus, the effects of the present embodiment can be obtained while reducing the disadvantages of the individual methods.

While in Patent Document 6 the strain relaxation layer is provided between the substrate and the quantum well, it is difficult to obtain a high-quality active layer because of the large difference in lattice constant between the substrate and the quantum well. In accordance with the present embodiment, the difference in lattice constant between the substrate and the spacer layer is small, so that high-quality active layers can be formed without applying a large strain to the active layers. Furthermore, in accordance with the present embodiment, the substrate and the quantum well layer are each formed to have a compressive strain, so that, together with the tensile strain in the spacer layers, a strain compensating effect can be expected.

In the case of Patent Document 7, the lattice constant of the DBR between the substrate and the active layer is gradually changed. Thus, although the difference in lattice constant between the active layer and the layer adjacent to the active layer is slight, a large stress is applied to the active layer due to the thickness of the strained layer, which is on the order of several μm, making it difficult to obtain a high-quality active layer. However, in accordance with the present embodiment, the difference in lattice constant between the substrate and the spacer layer is small, and the film thickness of the spacer layer is on the order of several hundred nm. Thus, high-quality active layers can be formed without applying a large strain to the active layer. Furthermore, in accordance with the present embodiment, the substrate and the quantum well layer are each formed to have a compressive strain, so that, together with the tensile strain in the spacer layers, a strain compensating effect can be expected.

In accordance with the present embodiment, the individual elements in the VCSEL can be two-dimensionally arrayed, where the element intervals can be set as desired. Thus, the number of light-emitting elements that can be integrated on a single chip can be increased compared with edge-emitting semiconductor lasers.

Eighth Embodiment

In accordance with the eighth embodiment of the present invention, a VCSEL includes a polarization control layer. The VCSEL is described with reference to FIGS. 2 and 4.

The VCSEL according to the present embodiment has the structure shown in FIG. 2 wherein the active layer 31 has the structure shown in FIG. 4. Specifically, the VCSEL includes the semiconductor substrate 11 with the inclined principal surface; the multiple quantum well layer 14 having a compressive strain with respect to the semiconductor substrate 11; and the lower spacer layer 13 and the upper spacer layer 15 in each of which a polarization control layer 41 is provided. In accordance with the eighth embodiment, the following is satisfied:

$$(ea \times ta + eb \times tb)/(ta+tb) < 0 \qquad (2)$$

where ea is the lattice strain in the lower spacer layer 13 and the upper spacer layer 15; ta is the total film thickness of the lower spacer layer 13 and the upper spacer layer 15; eb is the lattice strain in each polarization control layer 41; and tb is the total film thickness of the individual polarization control layers 41. The left part of the expression (2), i.e., (ea×ta+eb×tb)/(ta+tb), may be hereafter simply referred to as E.

When the expression (2) is satisfied, the polarization angle is stable at around 180 with respect to the (0-11) surface of the semiconductor substrate as shown in FIG. 3, so that a VCSEL having a constant polarization angle can be provided. While FIG. 4 shows the polarization control layer 41 being provided in each of the lower spacer layer 13 and the upper spacer layer 15, the polarization control layer 41 may be formed in either the lower spacer layer 13 or the upper spacer layer 15 as shown in FIG. 5, as long as the expression (1) is satisfied.

Although the lower spacer layer 13 and the upper spacer layer 15 are made of GaInPAs, the polarization control layer 41 is made of an AlGaInP material, i.e., InP to which one or more of Al, Ga, and As is added. In this way, a higher bandgap can be obtained in the polarization control layer 41. Thus, when the lower spacer layer 13 and the upper spacer layer 15 are made of a material with low bandgap, an improved electron-confining efficiency can be obtained.

As in the third embodiment shown in FIG. 7, the VCSELs according to the seventh or eighth embodiment of the present invention may be arrayed to construct a VCSEL array device. As in the fourth embodiment shown in FIG. 8, such a VCSEL array device may be used to construct an optical scanning apparatus. Further, as in the fifth embodiment shown in FIG. 9, an image forming apparatus having such an optical scanning apparatus may be provided. As in the sixth embodiment shown in FIG. 10, such an image forming apparatus may be used to construct a color image forming apparatus for forming a color image.

EXAMPLES

Hereafter, examples of the various embodiments of the present invention are described.

Example 1

Figure 11:
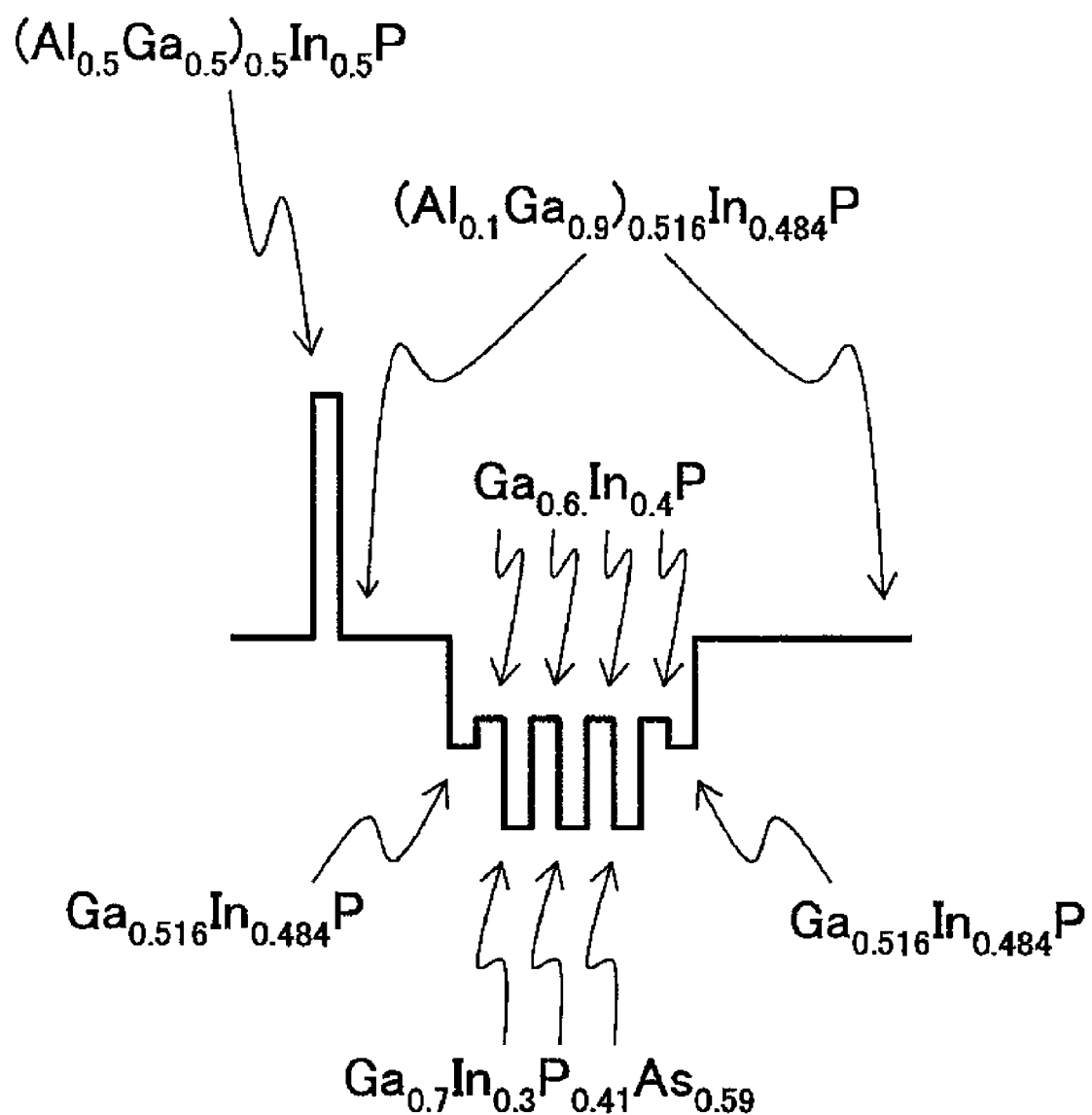
FIG. 11 shows the band structure of the active layer in a VCSEL according to Example 1.

A VCSEL according to Example 1 has the emission wavelength of 780 nm. The VCSEL is described with reference to FIGS. 2 and 11. FIG. 11 shows the band structure of the active layer 31 of the VCSEL.

Referring to FIG. 2, the VCSEL according to Example 1 includes the semiconductor substrate 11 formed from an n-GaAs substrate that is inclined in the direction of (111)

plane at 15°. On the semiconductor substrate 11, there is formed the lower reflecting mirror 12 that is a distributed Bragg reflector (DBR) formed by laminating 50 alternating pairs of n-$Al_{0.9}Ga_{0.1}As$ films and n-$Al_{0.3}Ga_{0.7}As$ films.

On top of the lower reflecting mirror 12, there is formed the lower spacer layer 13 from $(Al_{0.1}Ga_{0.9})_{0.516}In_{0.484}P$, followed by the multiple quantum well layer 14. On the multiple quantum well layer 14, there is formed the upper spacer layer 15 from $(Al_{0.1}Ga_{0.9})_{0.516}In_{0.484}P$, followed by the selective oxidization layer 16 of AlAs. On the selective oxidization layer 16, there is formed the upper reflecting mirror 17 that is a DBR formed from 30 pairs of alternating p-$Al_{0.9}Ga_{0.1}As$ and n-$Al_{0.3}Ga_{0.7}As$ films. On top of the upper reflecting mirror 17, there is formed the contact layer 18 from p-GaAs.

The individual layers have predetermined film thicknesses so that the emission wavelength of 780 nm can be obtained. The inclination angle of the semiconductor substrate 11 may be 2° to 20°.

Then, a mesa structure is formed in the resultant stack of the layers, and the selective oxidization layer 16 is partially oxidized in a water vapor atmosphere to form the oxidization region 32 and the current confined region 33. Thereafter, the protection film 19 is formed to cover the mesa structure. Then, the upper electrode 20 connecting to the contact layer 18 is formed from Au/AuZn, and the lower electrode 21 is formed on the back surface of the semiconductor substrate 11 from Au/Ni/AuGe.

Within the upper spacer layer 15, there is formed the polarization control layer 41 from $(Al_{0.5}Ga_{0.5})_{0.5}In_{0.5}P$, having the thickness of 20 nm. The polarization control layer 41 has the strain of +0.12% with respect to the semiconductor substrate 11. The lower spacer layer 13 and the upper spacer layer 15 each have the strain of 0% with respect to the semiconductor substrate 11. The multiple quantum well layer 14 comprises alternate layers of quantum well layers of $Ga_{0.7}In_{0.3}P_{0.41}As_{0.59}$ having the thickness of 5.5 nm and the strain of +0.71% with respect to the semiconductor substrate 11, and barrier layers of $Ga_{0.6}In_{0.4}P$ having the thickness of 8 nm and the strain of −0.6% with respect to the semiconductor substrate 11. On either side of the stack of the layers, there is formed a layer of $Ga_{0.516}In_{0.484}P$ having the thickness of 8 nm and the strain of zero with respect to the semiconductor substrate 11.

Figure 13:
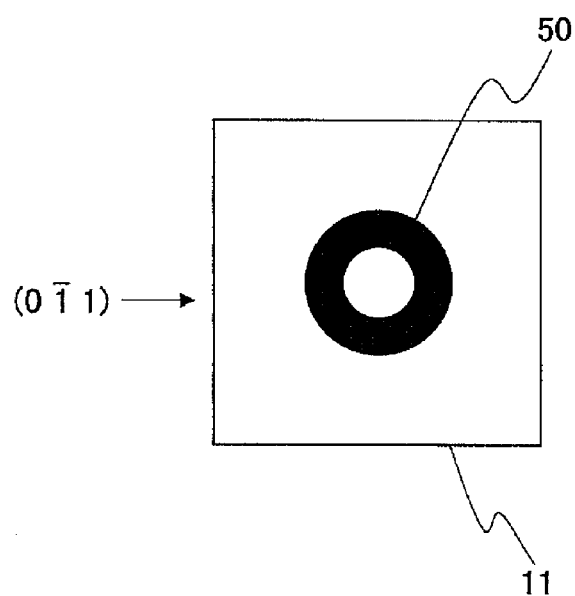
FIG. 13 shows a plan view of the VCSEL according to various Examples of the present invention.

In this VCSEL, the value of E is +0.023. Thus, as shown in FIG. 13, the light emitted by the VCSEL according to Example 1 is stabilized in a polarization direction that is 90° with respect to the (0-11) surface of the semiconductor substrate 11.

Example 2

Figure 14:
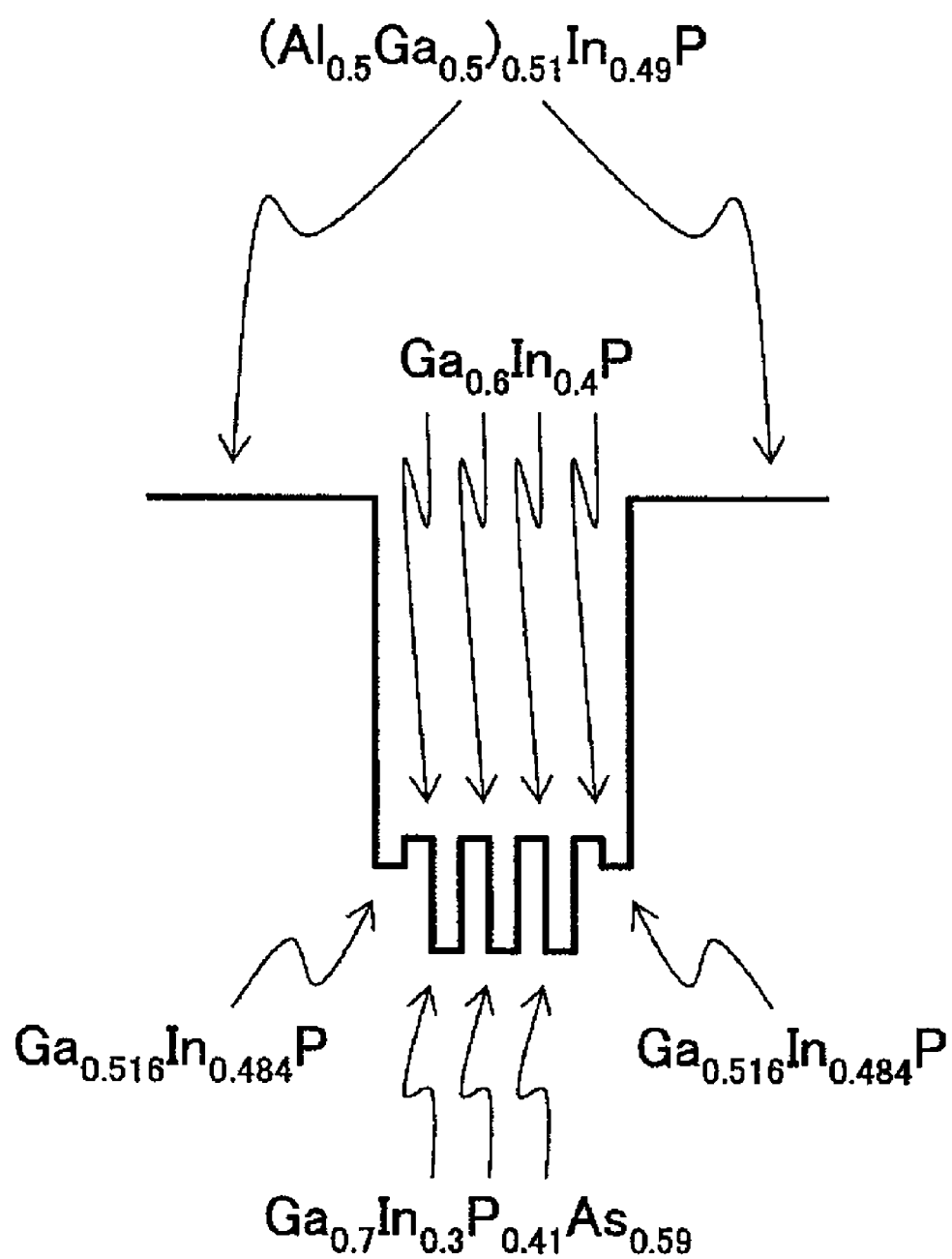
FIG. 14 shows the band structure of the active layer of a VCSEL according to Example 2.

The VCSEL according to Example 2 has the emission wavelength of 780 nm. The VCSEL is described with reference to FIGS. 2 and 14. FIG. 14 shows the band structure of the active layer 31 according to Example 2.

Referring to FIG. 2, the VCSEL includes the semiconductor substrate 11 comprising an n-GaAs substrate that is inclined in the direction of (111) plane at 15°. The lower reflecting mirror 12 is formed of a DBR comprising 50 pairs of alternating n-$Al_{0.9}Ga_{0.1}As$ films and n-$Al_{0.3}Ga_{0.7}As$ films. On top of the lower reflecting mirror 12, there is formed the lower spacer layer 13 from $(Al_{0.5}Ga_{0.5})_{0.51}In_{0.49}P$, followed by the multiple quantum well layer 14. On the multiple quantum well layer 14, there is formed the upper spacer layer 15 from $(Al_{0.5}Ga_{0.5})_{0.51}In_{0.49}P$, on top of which there is formed the selective oxidization layer 16 from AlAs. On top of selective oxidization layer 16, there is formed the upper reflecting mirror 17 that is a DBR comprising 30 pairs of alternating p-$Al_{0.9}Ga_{0.1}As$ films and n-$Al_{0.3}Ga_{0.7}As$ films. The contact layer 18 is formed on the upper reflecting mirror 17 from p-GaAs. The individual layers have predetermined film thicknesses so that the emission wavelength of 780 nm can be obtained. The inclination angle of the semiconductor substrate 11 may be 2° to 20°.

A mesa structure is then formed in the resultant stack of the layers, and then the selective oxidization layer 16 is partially oxidized in a water vapor atmosphere to form the oxidization region 32 and the current confined region 33. Thereafter, the protection film 19 is formed to cover the mesa structure, the upper electrode 20 connecting to the contact layer 18 is made from Au/AuZn, and the lower electrode 21 is formed on the back surface of the semiconductor substrate 11 from Au/Ni/AuGe.

The lower spacer layer 13 and the upper spacer layer 15 each have the strain of +0.04% with respect to the semiconductor substrate 11.

The multiple quantum well layer 14 comprises alternate layers of quantum well layers of $Ga_{0.7}In_{0.3}P_{0.41}As_{0.59}$ having the thickness of 5.5 nm and the strain with respect to the semiconductor substrate 11 of +0.71%, and barrier layers of $Ga_{0.6}In_{0.4}P$ having the thickness of 8 nm and the strain with respect to the semiconductor substrate 11 of −0.6%. On either side of the stack, there is formed a layer of $Ga_{0.516}In_{0.484}P$ having the thickness of 8 nm and the strain of zero with respect to the semiconductor substrate 11.

The VCSEL according to Example 2 has no polarization control layer. Thus, the strain in each of the lower spacer layer 13 and the upper spacer layer 15 with respect to the semiconductor substrate 11 is +0.04. Thus, as shown in FIG. 13, the light emitted by the VCSEL according to Example 2 is stable in a polarization direction that is 90° with respect to the (0-11) surface of the semiconductor substrate 11.

Example 3

Figure 15:
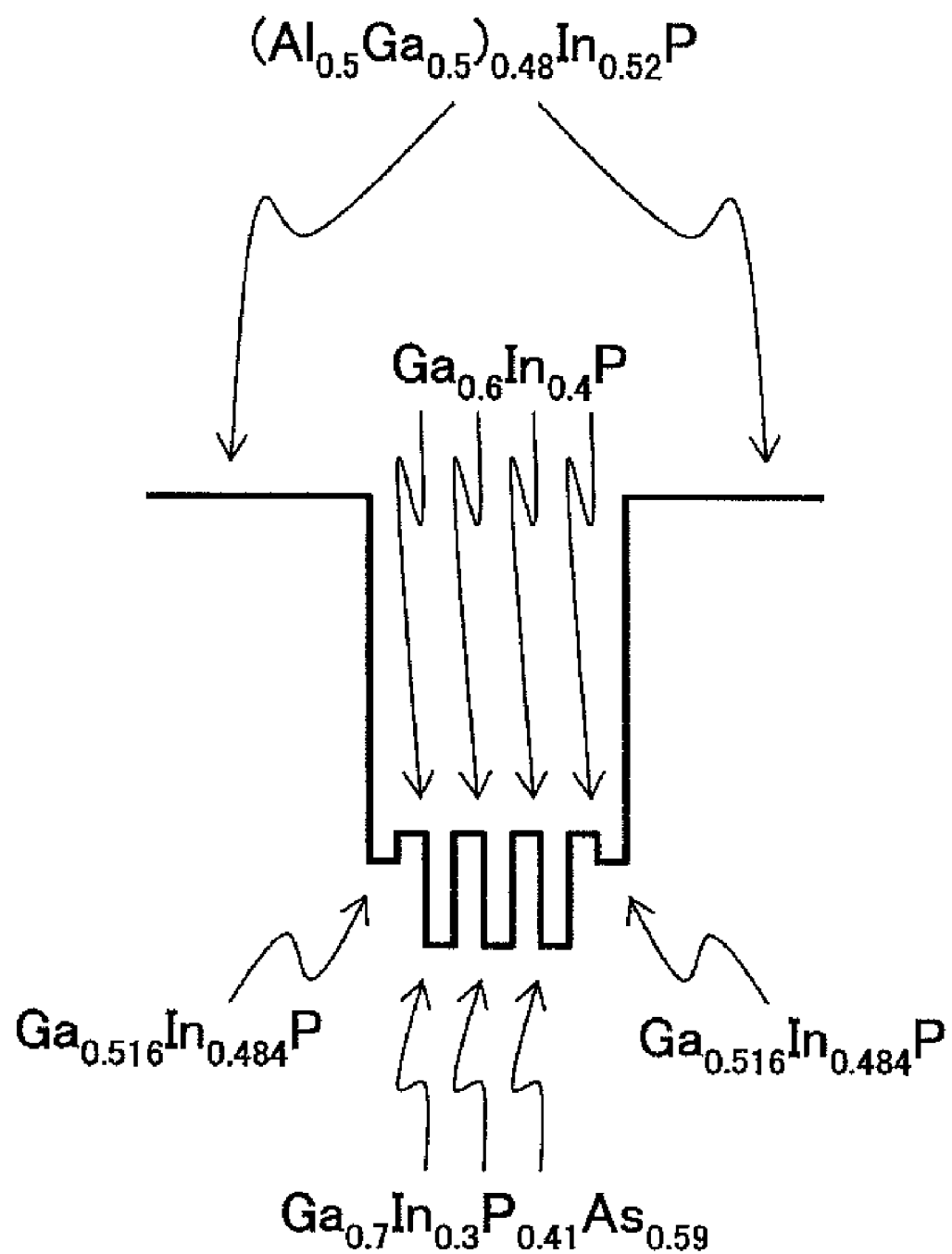
FIG. 15 shows the band structure of the active layer of a VCSEL according to Example 3.

The VCSEL according to Example 3 has the emission wavelength of 780 nm. The VCSEL is described with reference to FIGS. 2 and 15. FIG. 15 shows the band structure of the active layer 31 according to Example 3.

Referring to FIG. 2, the VCSEL according to Example 3 includes the semiconductor substrate 11 made from a n-GaAs substrate that is inclined in the direction of (111) plane at 15°. On top of the semiconductor substrate 11, there is formed the lower reflecting mirror 12 that is a DBR made from alternating layers of 50 pairs of n-$Al_{0.9}Ga_{0.1}As$ films and n-$Al_{0.3}Ga_{0.7}As$ films. On top of the lower reflecting mirror 12, there is formed the lower spacer layer 13 from $(Al_{0.5}Ga_{0.5})_{0.48}In_{0.52}P$, followed by the multiple quantum well layer 14. On top of the multiple quantum well layer 14, there is formed the upper spacer layer 15 from $(Al_{0.5}Ga_{0.59})_{0.48}In_{0.52}P$. The selective oxidization layer 16 is further formed on top of the multiple quantum well layer 14 from AlAs. On top of the selective oxidization layer 16, there is formed the upper reflecting mirror 17 from a DBR comprising alternating layers of 30 pairs of p-$Al_{0.9}Ga_{0.1}As$ films and n-$Al_{0.3}Ga_{0.7}As$ films. On top of the upper reflecting mirror 17, there is formed the contact layer 18 from p-GaAs.

The individual layers have predetermined film thicknesses so that the emission wavelength of 780 nm can be obtained. The inclination angle of the semiconductor substrate 11 may be 2° to 20°.

A mesa structure is then formed in the resultant stack of the layers, and then the selective oxidization layer 16 is partially oxidized in a water vapor atmosphere to form the oxidization region 32 and the current confined region 33. Thereafter, the protection film 19 is formed to cover the mesa structure, and the upper electrode 20 connecting to the contact layer 18 is formed from Au/AuZn and the lower electrode 21 is formed on the back surface of the semiconductor substrate 11 from Au/Ni/AuGe.

The lower spacer layer 13 and the upper spacer layer 15 each have the strain of +0.27% with respect to the semiconductor substrate 11.

The multiple quantum well layer 14 comprises alternate layers of quantum well layers of $Ga_{0.7}In_{0.3}P_{0.41}As_{0.59}$ having the thickness of 5.5 nm and the strain with respect to the semiconductor substrate 11 of +0.71%, and barrier layers of $Ga_{0.6}In_{0.4}P$ having the thickness of 8 nm and the strain with respect to the semiconductor substrate 11 of −0.6%. On either side of the stack of the layers, there is formed a layer of $Ga_{0.516}In_{0.484}P$ having the thickness of 8 nm and the strain with respect to the semiconductor substrate 11 of zero.

The VCSEL according to Example 3 thus has no polarization control layer. Thus, the strain in each of the lower spacer layer 13 and the upper spacer layer 15 with respect to the semiconductor substrate 11 is +0.27. Thus, as shown in FIG. 13, the light emitted by the VCSEL 50 according to Example 3 is stable in a polarization direction that is 90 with respect to the (0-11) surface of the semiconductor substrate 11.

Example 4

Figure 12:
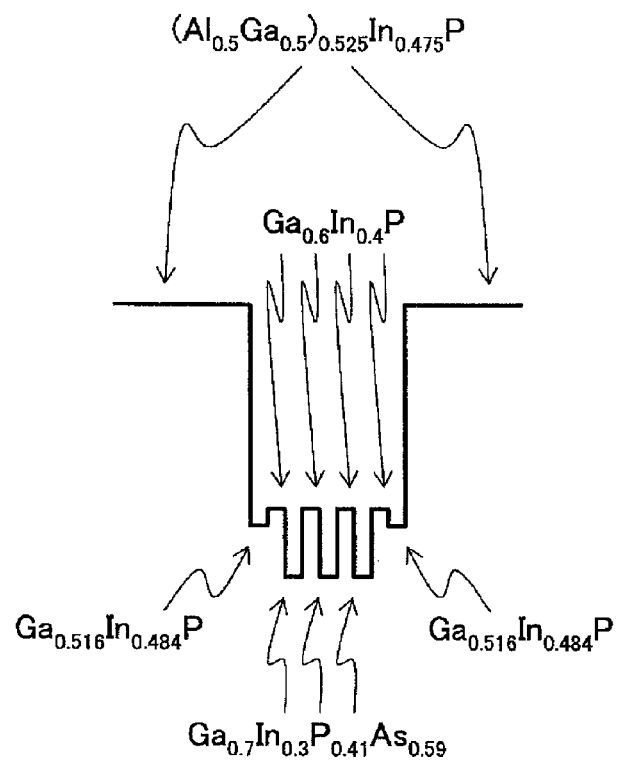
FIG. 12 shows the band structure of the active layer in a VCSEL according to Example 4.

The VCSEL according to Example 4 is described with reference to FIGS. 2 and 12. The VCSEL has the emission wavelength of 780 nm. FIG. 12 shows the band structure of the active layer 31 of the VCSEL.

Referring to FIG. 2, the VCSEL includes the semiconductor substrate 11 formed from a n-GaAs substrate inclined in the direction of (111) plane at 15°. On top of the semiconductor substrate 11, there is formed the lower reflecting mirror 12 of a DBR comprising alternate layers of 50 pairs of n-$Al_{0.9}Ga_{0.1}As$ films and n-$Al_{0.3}Ga_{0.7}As$ films. On top of the lower reflecting mirror 12, there is formed the lower spacer layer 13 from $(Al_{0.5}Ga_{0.5})_{0.525}In_{0.475}P$, followed by the multiple quantum well layer 14. On top of the multiple quantum well layer 14, there is formed the upper spacer layer 15 from $(Al_{0.5}Ga_{0.5})_{0.525}In_{0.475}P$, on top of which there is further formed the selective oxidization layer 16 from AlAs. On top of the selective oxidization layer 16, there is formed the upper reflecting mirror 17 from a DBR comprising alternate layers of 30 pairs of p-$Al_{0.9}Ga_{0.1}As$ films and n-$Al_{0.3}Ga_{0.7}As$ films. On top of the upper reflecting mirror 17, there is formed the contact layer 18 from p-GaAs.

The individual layers have predetermined film thicknesses so that the emission wavelength of 780 nm can be obtained. The inclination angle of the semiconductor substrate 11 may be 2° to 20°.

A mesa structure is then formed from the resultant stack of the layers, and the selective oxidization layer 16 is partially oxidized in a water vapor atmosphere to form the oxidization region 32 and the current confined region 33. Thereafter, the protection film 19 is formed to cover the mesa structure, followed by the formation of the upper electrode 20 connecting to the contact layer 18 from Au/AuZn and the lower electrode 21 on the back surface of the semiconductor substrate 11 from Au/Ni/AuGe.

The lower spacer layer 13 and the upper spacer layer 15 each have the strain with respect to the semiconductor substrate 11 of −0.05%.

The multiple quantum well layer 14 includes alternate layers of quantum well layers of $Ga_{0.7}In_{0.3}P_{0.41}As_{0.59}$ having the thickness of 5.5 nm and the strain with respect to the semiconductor substrate 11 of +0.71%, and barrier layers of $Ga_{0.6}In_{0.4}P$ having the thickness of 8 nm and the strain with respect to the semiconductor substrate 11 of −0.6%. On either side of the stack of the layers, there is formed a layer of $Ga_{0.516}In_{0.484}P$ having the thickness of 8 nm and the strain with respect to the semiconductor substrate 11 of zero.

In this VCSEL, the strain in each of the lower spacer layer 13 and the upper spacer layer 15 with respect to the semiconductor substrate 11 is −0.05. Thus, as shown in FIG. 13, the light emitted by the VCSEL 50 according to Example 4 is stable in a polarization direction that is 180° with respect to the (0-11) surface in the semiconductor substrate 11.

Although this invention has been described in detail with reference to certain embodiments and examples, variations and modifications exist within the scope and spirit of the invention as described and defined in the following claims.

The present application is based on the Japanese Priority Applications No. 2008-146000 filed Jun. 3, 2008, No. 2008-165106 filed Jun. 24, 2008, No. 2009-098363 filed Apr. 14, 2009, and No. 2009-098364 filed Apr. 14, 2009, the entire contents of which are hereby incorporated by reference.

What is claimed is:

1. A vertical cavity surface emitting laser comprising:
a semiconductor substrate;
a lower reflecting mirror formed on a surface of the semiconductor substrate by alternately forming layers of semiconductor films having different refraction indexes;
an active layer formed on the lower reflecting mirror from a semiconductor material;
a selective oxidization layer formed on the active layer that is partially oxidized, forming a current confined structure;
an upper reflecting mirror formed on the selective oxidization layer by alternately forming semiconductor films having different refraction indexes,
wherein a mesa structure is formed in at least the active layer, the selective oxidization layer, and the upper reflecting mirror on the semiconductor substrate,
a lower electrode connected to the semiconductor substrate;
and an upper electrode connected to the upper reflecting mirror,
the surface emitting laser emitting laser light perpendicularly to the plane of the semiconductor substrate when an electric current flows between the upper electrode and the lower electrode, wherein:
the surface of the semiconductor substrate is inclined with respect to a particular plane,
the active layer includes a quantum well layer having a compressive strain with respect to the substrate, and a spacer layer, and
wherein the spacer layer has a specific strain with respect to the semiconductor substrate, said specific strain being a compressive strain or a tensile strain.

2. The vertical cavity surface emitting laser according to claim 1, wherein the spacer layer is formed from InP to which one or more of Al, Ga, and As is added.

3. The vertical cavity surface emitting laser according to claim 1, wherein the semiconductor substrate is inclined with respect to (100) plane.

4. The vertical cavity surface emitting laser according to claim 1, wherein the semiconductor substrate is inclined with respect to (010) or (001) plane.

5. The vertical cavity surface emitting laser according to claim 3, wherein the semiconductor substrate is inclined in the direction of (111) plane.

6. The vertical cavity surface emitting laser according to claim 5, wherein the inclination angle of the semiconductor substrate is not more than 20°.

7. The vertical cavity surface emitting laser according to claim 1, wherein the quantum well layer includes a single quantum well layer or a multiple quantum well layer including a plurality of quantum well layers and barrier layers.

8. The vertical cavity surface emitting laser according to claim 1, wherein the spacer layer includes a polarization control layer, wherein the polarization control layer satisfies the following expression:

$$(ea \times ta + eb \times tb)/(ta + tb) > 0 \qquad (1)$$

where ea is the lattice strain in the spacer layer, ta is the film thickness of the spacer layer, eb is the lattice strain in the polarization control layer, and tb is the film thickness of the polarization control layer.

9. The vertical cavity surface emitting laser according to claim 8, wherein the polarization control layer is formed from InP to which one or more of Al, Ga, and As is added.

10. The vertical cavity surface emitting laser according to claim 1, wherein the spacer layer includes a polarization control layer, wherein the polarization control layer satisfies the following expression:

$$(ea \times ta + eb \times tb)/(ta + tb) < 0 \qquad (2)$$

where ea is the lattice strain in the spacer layer, ta is the film thickness of the spacer layer, eb is the lattice strain in the polarization control layer, and tb is the film thickness of the polarization control layer.

11. The vertical cavity surface emitting laser according to claim 10, wherein the polarization control layer is formed from InP to which one or more of Al, Ga, and As is added.

12. A vertical cavity surface emitting laser array device comprising a plurality of the vertical cavity surface emitting lasers according to claim 1 arranged on a semiconductor substrate.

13. An optical scanning apparatus for scanning a scanned surface with a light beam, comprising:
a light source unit including the vertical cavity surface emitting laser array device according to claim 12;
a deflecting unit configured to deflect a light beam emitted by the light source unit; and
a scanning optical system configured to focus the light beam deflected by the deflecting unit on the scanned surface.

14. An image forming apparatus comprising:
at least one image carrier; and
an optical scanning apparatus configured to scan the image carrier with a beam of light, the optical scanning apparatus comprising a light source unit, a deflecting unit configured to deflect a light beam emitted by the light source unit, and a scanning optical system configured to focus the light beam deflected by the deflecting unit on a scanned surface of the image carrier, wherein
the light source unit includes a vertical cavity surface emitting laser array device comprising:
a semiconductor substrate;
a lower reflecting mirror formed on a surface of the semiconductor substrate by alternately forming layers of semiconductor films having different refraction indexes;
an active layer formed on the lower reflecting mirror from a semiconductor material;
a selective oxidization layer formed on the active layer that is partially oxidized, forming a current confined structure;
an upper reflecting mirror formed on the selective oxidization layer by alternately forming semiconductor films having different refraction indexes, wherein a mesa structure is formed in at least the active layer, the selective oxidization layer, and the upper reflecting mirror on the semiconductor substrate;
a lower electrode connected to the semiconductor substrate; and
an upper electrode connected to the upper reflecting mirror, wherein
the surface emitting laser emitting laser light perpendicularly to the plane of the semiconductor substrate when an electric current flows between the upper electrode and the lower electrode,
the surface of the semiconductor substrate is inclined with respect to a particular plane,
the active layer includes a quantum well layer having a compressive strain with respect to the substrate, and a spacer layer, and
the spacer layer has a specific strain with respect to the semiconductor substrate, said specific strain being a compressive strain or a tensile strain.

15. A vertical cavity surface emitting laser comprising:
a semiconductor substrate;
a lower reflecting mirror formed on a surface of the semiconductor substrate by alternately forming layers of semiconductor films having different refraction;
an active layer formed on the lower reflecting mirror from a semiconductor material;
a selective oxidization layer formed on the active layer that is partially oxidized, forming a current confined structure;
an upper reflecting mirror formed on the selective oxidization layer by alternately forming semiconductor films having different refraction indexes,
wherein a mesa structure is formed in at least the active layer, the selective oxidization layer, and the upper reflecting mirror,
the vertical cavity surface emitting laser further comprising:
a lower electrode connected to the semiconductor substrate; and
an upper electrode connected to the upper reflecting mirror,
the vertical cavity surface emitting laser emitting laser light perpendicularly to the plane of the semiconductor substrate when an electric current flows between the upper electrode and the lower electrode, wherein:
the surface of the semiconductor substrate is inclined with respect to a predetermined plane,
the active layer includes a quantum well layer having a compressive strain with respect to the substrate, an upper spacer layer formed on the upper side of the quantum well layer, and a lower spacer layer formed on the lower side of the quantum well layer, and
wherein the upper spacer layer and the lower spacer layer have a specific strain with respect to the semiconductor substrate.

* * * * *